US000001444H

United States Statutory Invention Registration [19]

[11] Reg. Number: H1444

Gish et al.

[43] Published: Jun. 6, 1995

[54] VME SLAVE TESTER

[75] Inventors: Kevin S. Gish, Avenue, Md.; Mark T. Mallinder, Marlton, N.J.

[73] Assignee: United States of America, Washington, D.C.

[21] Appl. No.: 982,653

[22] Filed: Nov. 30, 1992

[51] Int. Cl.[6] ..... G01R 31/28

[52] U.S. Cl. ..... 371/15.1; 371/17

[58] Field of Search ..... 371/15.1, 17

[56] References Cited

U.S. PATENT DOCUMENTS

| | | | |
|---|---|---|---|
| 4,748,573 | 5/1988 | Sarandrea et al. | 364/551 |
| 4,797,884 | 1/1989 | Yalowitz et al. | 371/9 |
| 5,058,110 | 10/1991 | Beach et al. | 371/37.7 |
| 5,146,461 | 9/1992 | Duschatko et al. | 371/40.1 |
| 5,157,326 | 10/1992 | Burnsides | 324/158 |
| 5,265,237 | 11/1993 | Tobias et al. | 395/500 |

*Primary Examiner*—Bernarr E. Gregory
*Attorney, Agent, or Firm*—Thomas E. McDonnell; George Jameson

[57] ABSTRACT

A VME Slave Tester includes board selector logic for indicating when an address being monitored is selected for a data transfer, and a data transfer circuit for generating signals necessary to complete data transfers, and for indicating an unsuccessful data transfer. In addition, the VME Slave Tester includes first in/first out (FIFO) logic for storing data that must be written to the board and for outputting data that must be read from the board, and front panel control logic for interfacing external switches to the VME Slave Tester digital circuitry. Finally, the VME Slave Tester includes display logic for indicating the number of items of data presently stored and for viewing the stored data and the present address and AM Code configurations of the VME Slave Tester.

6 Claims, 6 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

VME SLAVE TESTER

BACKGROUND OF THE INVENTION

1. Field of the Invention

The present invention relates to a VME Slave Tester, and more particularly, to a VME Slave Tester interfacing to a standard VMEbus to assist a user in determining the source or cause of a problem related to specific hardware connected to the VMEbus and its associated software. The present invention performs this operation by monitoring data transfers to and from selected addresses of a VME slave module.

2. Background of the Related Art

A few years ago there did not exist any analyzers which were designed specifically for the VMEbus protocol. Instead, a variety of general-purpose logic analyzers were available for determining the cause of a problem in a functional module connected to an interface bus.

These general-purpose logic analyzers contain a wide variety of features and consequently, possess major disadvantages in size, cost and operational complexity. Specifically, the typical size and weight of general-purpose logic analyzers makes them inconvenient to transport and store. In addition, general-purpose logic analyzers are prohibitively expensive if only used for trouble-shooting functional modules connected to a VMEbus, since these analyzers contain many additional features which are not needed. Further, to utilize an analyzer effectively, the analyzer must be configured for a given set of tests. This configuration involves establishing various parameters to indicate the specific signals to analyze, the timing period of the sampling clock, and the conditions for triggering the analyzers. This complexity of configuring general-purpose analyzers for analyzing data relating to the VMEbus seriously limits their use in diagnosing whether a VME slave module has defective hardware or software.

The VME Slave Tester, which is the present invention, is more suitable than a general-purpose logic analyzer in trouble-shooting errors in functional modules connected to the VMEbus. Specifically, a general-purpose analyzer is able to determine the source of an error in a VME card already known to be defective. However, the VME Slave Tester is better suited for initially localizing the source of an operational problem in a complete functional VME system. Using the VME Slave Tester, the source of a problem can be more easily tracked to a specific functional module and it can be determined whether the error is caused by the module's hardware or its associated software. Once the error is identified as a hardware or software problem, the problem can be quickly corrected. For instance, if the hardware is defective, a new VME slave board can be inserted into the VME system to replace the defective VME board. In addition, if the VME Slave Tester determines that the problem is in software, the software can then be debugged to permit the VME system to return to full operation. Thus, the VME Slave Tester permits a VME system having hardware or software failures to be brought back to full operation efficiently and quickly. Hence, the VME Slave Tester of the present invention is superior to the general-purpose analyzer in initial VME problem identification. Further, general-purpose analyzers are not designed to replace the module which is being analyzed, as is the present invention.

SUMMARY OF THE INVENTION

It is therefore an object of the present invention to provide a VME Slave Tester which is small in size and used for monitoring data transfers to and from selected addresses of a VME slave module.

It is another object of the present invention to provide an inexpensive VME Slave Tester for monitoring data transfers to and from selected addresses of a VME slave module.

Another object of the present invention is to provide an uncomplicated and simple VME Slave Tester which is easy to use.

It is an additional object of the present invention to provide a VME Slave Tester which can replace the VME slave module to determine whether the VME slave module has defective hardware or software.

In carrying out the above objects of the present invention, there is provided a VME Slave Tester which includes board selector logic for indicating when an address being monitored is selected for a data transfer, and a data transfer circuit for generating signals necessary to complete data transfers, and for indicating an unsuccessful data transfer. In addition, the present invention includes first in/first out (FIFO) logic for storing data that must be written to the board and for outputting data that must be read from the board, and front panel control logic for interfacing external switches to the VME Slave Tester digital circuitry. Finally, the present invention includes display logic for indicating the number of items of data presently stored and for viewing the stored data and the present address and address modifier (AM) code configurations of the VME Slave Tester.

These, together with other objects and advantages which will be subsequently apparent, reside in the details of construction and operation, as more fully hereinafter described and claimed, reference being made to the accompanying drawings forming a part hereof, wherein like reference numerals refer to like parts throughout.

DESCRIPTION OF THE PREFERRED EMBODIMENT

Figure 1:
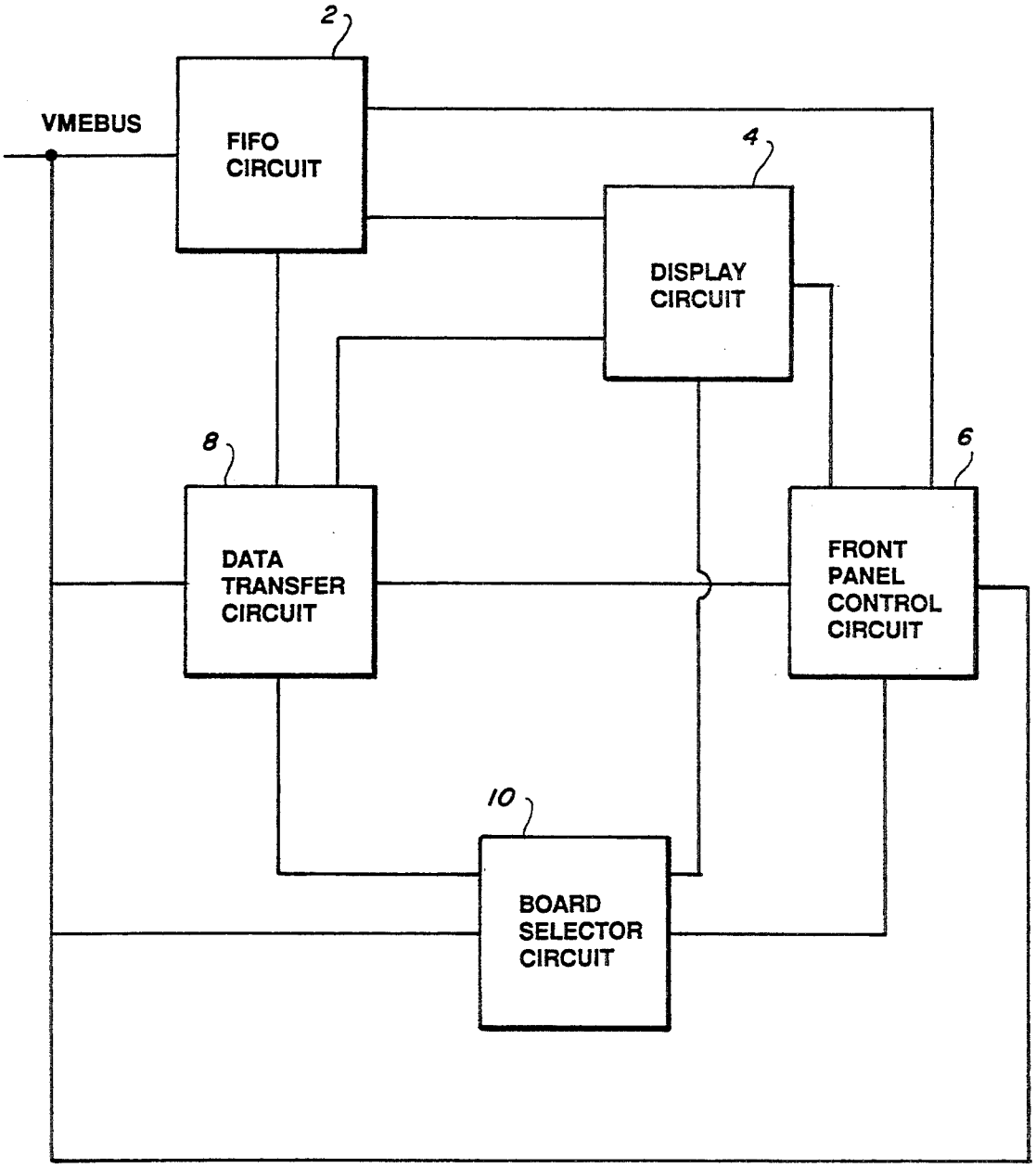
FIG. 1 is a block diagram of the present invention.

Referring to FIG. 1, a conceptual description of the present invention is presented. During operation of the VME Slave Tester illustrated in FIG. 1, the VME Slave Tester interfaces with a VMEbus to receive data from a VME master (not shown) and to transmit data back to the VME master as described below. The VME Slave Tester operates in two functional modes: monitor or replace. In the monitor mode, the VME Slave Tester monitors signals issued from the VME master transmitted by the VMEbus to a VME slave. In the monitor mode, the VME Slave Tester does not transmit signals back to the VME master. In the replace mode, the VME Slave Tester actually replaces the VME slave which is to be tested and is inserted into the slot which was designated for the VME slave. In this mode, the VME master sends signals via the VMEbus directly to the VME Slave Tester, and the VME Slave Tester transmits signals back to the VME master.

The board selector circuit 10 indicates when an address being monitored is selected for a data transfer cycle. The address cannot be selected during interrupt cycles on the VMEbus. The board selector circuit 10 receives address information from the VMEbus and allows the user to select the addresses to be monitored by the VME Slave Tester. Further, the board selector circuit 10 indicates to the data transfer circuit 8 when the address chosen by a user for monitoring has been selected on the VMEbus to receive data from or transfer data to the VMEbus.

The data transfer circuit 8 generates signals necessary to complete data transfers involving the VME Slave Tester as well as indicates an unsuccessful data transfer involving the VME Slave Tester. The data transfer circuit 8 indicates to the FIFO circuit 2 when the VME Slave Tester is ready to receive data from or send data to the VMEbus.

The first in/first out (FIFO) circuit 2 stores data that must be written to the VME board and outputs data that must be read from the VME board. The first in/first out circuit 2 transmits to the display circuit 4 the stored data which was received from the VMEbus so that it can be displayed for viewing by the user. In addition, the first in/first out circuit 2 indicates, by sending signals to the data transfer circuit 8, whether the first in/first out circuit 2 is ready to receive data from or transmit data to the VMEbus.

The front panel control circuit 6 is used to interface the various switches contained on the board with different areas of the VME board in the present invention. The front panel control circuit 6 indicates to the display circuit 4 whether the VME Slave Tester is in the data display mode, the address display mode, or the address modifier code display mode as set by a user. The front panel control circuit 6 also indicates to the data transfer circuit 8 whether the VME Slave Tester is in the replace or monitor mode. The front panel control circuit 6 also indicates to the display circuit 4 when the user has initiated a manual readout operation. It also indicates when the user has initiated a manual reset of the VME Slave Tester.

The display circuit 4 controls various displays which are viewed by a user. The display circuit 4 preferably includes a two-digit decimal display for indicating the number of items of data presently stored in the first in/first out circuit 2, and an eight-digit hexadecimal display for viewing data which is stored in the first in/first out circuit 2 and the present address and address modifier configurations of the VME Slave Tester. Further, the display circuit 4 may also include various light-emitting diodes (LED's) for indicating that the VME Slave Tester is in use, that a bus error has occurred, that the VME Slave Tester configuration is incorrect, or that data being displayed was obtained during a read or write operation. The display circuit 4 indicates to the first in/first out circuit 2 when data is to be output for displaying during a manual readout operation.

Figure 2:
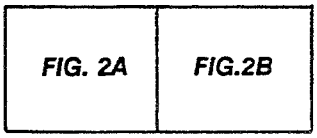
FIG. 2 is a diagram illustrating the positional orientation of FIGS. 2A and 2B.
Figure 2A:
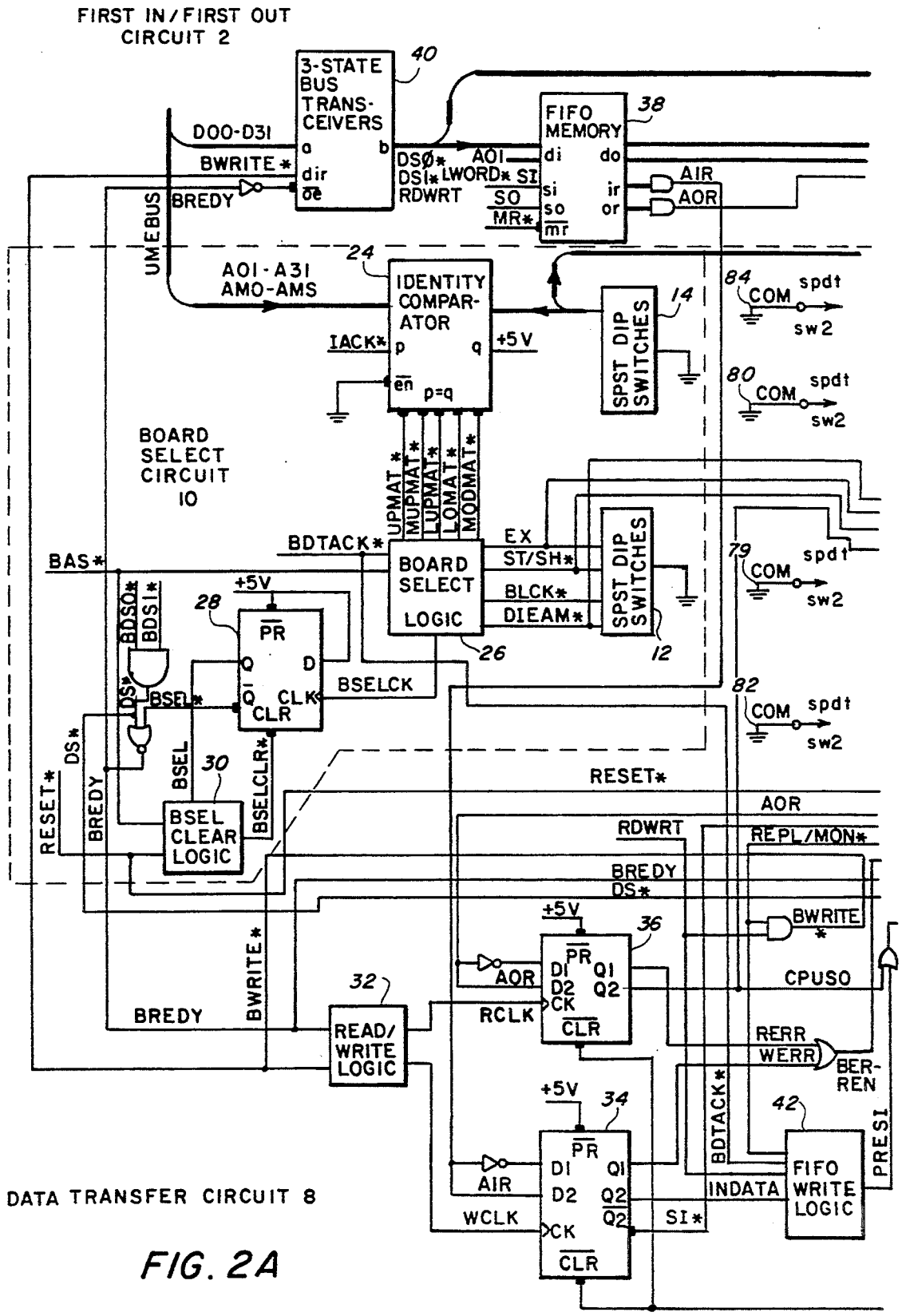
FIGS. 2A and 2B are circuit diagrams of the preferred embodiment of the present invention.
Figure 2B:
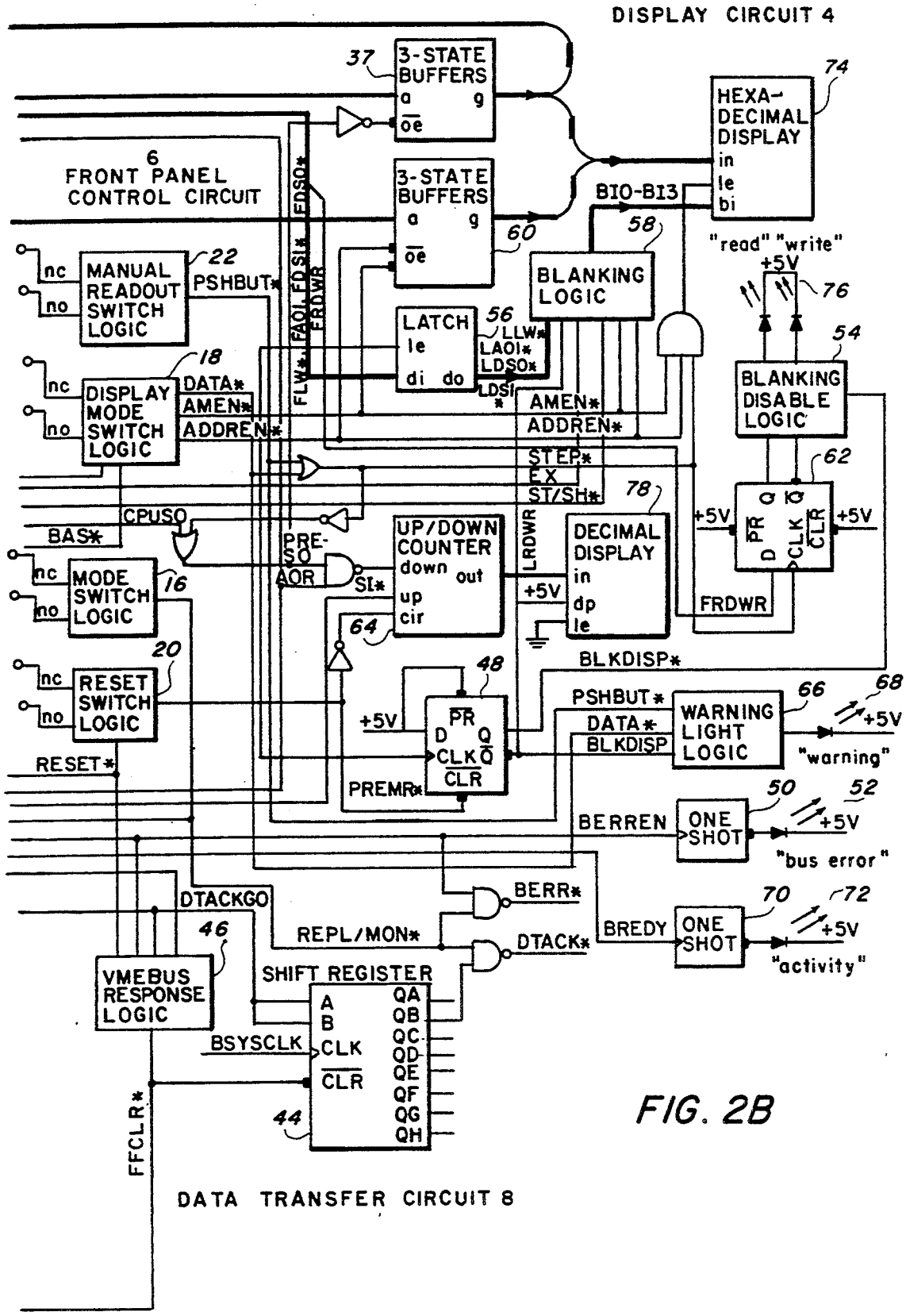

A detailed description of the VME Slave Tester according to the preferred embodiment will now be discussed with reference to FIGS. 2A and 2B. Prior to operation, conventional dip switches 12 and 14 are set to indicate the proper address or addresses and the address modifier (AM) code which the VME Slave Tester is to monitor. The switches 12 and 14 may select up to a 32 bit address which may be monitored as required by a user.

Next, mode switch logic 16 is set to indicate whether the VME Slave Tester is to be operated in the replace or monitor mode. If the VME Slave Tester is to be operated in the monitor mode, the VME Slave Tester stores data written to or read from the slave module which it is monitoring. If the VME Slave Tester is operating in the replace mode, the VME Slave Tester stores data during write cycles and sends stored data to the VMEbus during read cycles, which are intended for the slave module. In the replace mode, the VME Slave Tester physically replaces the slave module which is to be monitored. The mode switch logic 16 is implemented using SPDT (single-pole, double-throw) toggle switch 79 and an SR-latch as a switch debouncer. The mode switch logic 16 generates the replace or monitor signal, REPL/MON*, where * indicates that the monitor mode is indicated when the signal is a logic low, and the above signal is described in the APPENDIX.

In addition, display mode switch logic 18 indicates what type of information is to be sent to the display circuit 4. Specifically, the display mode switch logic 18 indicates whether to send data, address, or address modifier codes to be displayed. The display mode switch logic 18 may be implemented according to the conventional Boolean expressions:

$$DATA^* = \overline{ADDR^* \cdot ADMOD^*},$$

$$AMEN^* = \overline{BAS^* \cdot BLKDISP \cdot DISAM^* \cdot ADMOD},$$

and $$ADDREN^* = \overline{BAS^* \cdot BLKDISP \cdot ADDR},$$

where the above signals are described in the APPENDIX.

These Boolean expressions may be conveniently implemented using, for example, conventional AND/OR gates and 3-position toggle switch 80. The reset switch logic 20 manually resets the VME Slave Tester and clears all data which is being stored. Reset switch logic 20 may be implemented according to the following Boolean expression:

$$PREMR^* = RESET^* \cdot MANRES^*$$

where MANRES, is the output of an S-R latch switch debouncer driven by SPDT momentary-contact pushbutton switch 82. Manual readout switch logic 22 is used to signal when data which is stored by the VME Slave Tester is to be sent to the display by the user. The manual read-out switch logic 22 generates the pushbutton signal, PSHBUT*, which is the output of an S-R latch switch debouncer driven by SPDT switch 84.

VMEbus devices are designed to respond to a selected set of address/address modifier code combinations. Dip switches 12 and 14 are used to allow the flexibility of configuring the VME Slave Tester board to respond to different VMEbus address/address modifier code combinations, or to a block of addresses. Identity comparator 24, which is a conventional address comparison circuit and always enabled for a comparison, compares address/address modifier code combinations on the VMEbus lines to the setting of dip switches 14. In addition, board select logic 26 receives five signals from the identity comparator 24 indicating the results of the comparison for each of the four bytes of the address and the address modifier code. Dip switches 12 then specify which of the comparisons the board select logic 26 is to consider and which of the comparisons the board select logic 26 is to ignore. The board select logic 26 may be implemented according to the following conventional Boolean expression:

$$BSELECT=BDTACK^*\cdot[\overline{(MODMAT^*\cdot DISAM^*)+BAS^*+LUPMAT^*}]\cdot(ST/SH^*\cdot MUPMAT^*+EX\cdot UPMAT^*\cdot BLCK^*\cdot LOMAT^*).$$

Once again these signals are discussed in the APPENDIX. D-Latch 28, which is conventional and connected to the board select logic 26, keeps the VME Slave Tester board enabled for data transfers until the VME Slave Tester board is cleared by the board select clear logic 30, which generates the board select clear (BSELCLR) signal responsive to the following two conditions: (1) a system reset from the VMEbus or (2) at the end of a data transfer cycle in which an address being monitored had been selected by the VMEbus master. The board select clear logic 30 may be implemented according to the conventional Boolean expression:

$$BSELCLR^*=RESET^*\cdot(\overline{BAS^*\cdot BSEL}),$$

where the above signals are described in the APPENDIX.

Read/write logic 32 determines whether the VME Slave Tester is to receive or send data. The decision is based on whether the VME Slave Tester board is ready, on the read/write (RDWRT) signal received from the VME master via the VMEbus, and on whether the VME Slave Tester is in the monitor or replace mode. The read/write (RDWRT) signal controls the direction of bus transceiver 40 to pass data to or from the VMEbus. Read/write logic 32 may be implemented according to the following conventional Boolean expressions:

$$RCLK=BREDY\cdot BWRITE^*,$$

and $$WCLK=BREDY\cdot BWRITE,$$

as described in the APPENDIX. If the VME Slave Tester is to receive data and all the FIFO memories in conventional FIFO memory 38 are ready to receive data, then conventional latches 34 generate a signal (INDATA) which is transmitted to FIFO Write logic 42. FIFO write logic 42 is used to generate a signal to clock the data into FIFO memory 38. FIFO write logic 42 may be implemented according to the following conventional Boolean expression:

$$PRESI=INDATA\cdot(\overline{BDTACK^*\cdot REPL/MON^*\cdot RDWRT}),$$

where the above signals are described in the APPENDIX. If not all of the FIFO memories are ready in FIFO memory 38, a bus error (BERR) signal is generated and used to display to the user that not all of the FIFO memories are ready to receive the data. This bus error (BERR) signal is transmitted to a conventional one shot 50 which activates a conventional light-emitting diode 52 to visually indicate to a user that a bus error has occurred. F14.

If the VME Slave Tester is to send data to the VME master via the VMEbus, and all FIFO memories are ready to send the data, conventional latches 36 generate a signal (CPUSO) which is used to generate another signal (PRESO) to enable buffer 37 and to clock data out of the FIFO memory 38 so that data is sent to the VME master. If not all of the FIFO memories are ready to send data to the VME master, a bus error (BERR) signal is transmitted, as similarly done in connection with latches 34.

Conventional shift register 44 is used to complete the process of receiving data from or sending data to the VME master by sending a data transfer acknowledge (DTACK) signal to the VMEbus.

VMEbus response logic 46 is used to clear latches 34 and 36 and shift register 44 when the reset switch logic 20 generates a reset (RESET) signal or at the end of a data transfer cycle. The VMEbus response logic 46 may be implemented according to the following conventional Boolean expression:

$$FFCLR^*=RESET^*\cdot[DS^*\cdot(\overline{DTACKGO\cdot BERREN})],$$

where the above signals are described in the APPENDIX.

Conventional flip-flop 48 generates a blank display (BLKDISP) signal which is sent to blanking disable logic 54 to control blanking of light emitting diodes 76, which indicate whether stored data being displayed was obtained during a read or write cycle. This information is received by flip-flop 62. The blanking disable logic 54 may be implemented by the Boolean expressions output to "read" LED=$\overline{BLKDISP^*\cdot LRDWR}$, and output to "write" LED=$\overline{BLKDISP^*\cdot LRDWR^*}$, where the above signals are described in the APPENDIX.

The blank display (BLKDISP) signal is transmitted to blanking logic 58 along with the control signals which are sent from the VMEbus through latch 56. Blanking logic 58 uses the above signals to determine what digits of the hexadecimal display 74 will be blanked. In addition, buffer 60 transmits the settings of dip switches 14 to indicate to the hexadecimal display 74 which address/address modifier codes (ADDR/ADMOD's) have been selected for comparison. Blanking logic 58 may be implemented according to the following conventional Boolean expressions:

$$BI0=(\overline{ADDREN+EX})+(\overline{LLW^*+BLKDISP})\cdot(\overline{LDS0^*+LDS1^*}),$$

$$BI1=(ADDREN^*+\overline{ST/SH})\cdot(LLW^*+BLKDISP),$$

$$BI2=ADDREN^*\cdot[BLKDISP+(LDS1^*\cdot LLW^*)],$$

and $$BI3=ADDREN^*\cdot AMEN^*\cdot(BLKDISP+LDS0^*+LLW\cdot LA01),$$

where the above signals are described in the APPENDIX.

Up/down counter 64 is used to count up how much data is being stored in the FIFO memory 38 when data is written into the FIFO memory 38, and also to count down how much data is being removed from the FIFO memory 38 when data is read from the FIFO memory 38. The results of the up/down counter 64 are then transmitted to conventional decimal display 78 which is a two-digit display indicating the amount of data presently stored in FIFO memory 38.

Warning light logic 66 is used to light the light emitting diode warning indicator 68 when the display mode switch 80 is not set for displaying data while the manual readout switch 84 is being depressed. In addition, one-shot 70 is used to illuminate the light-emitting diode activity indicator 72 when the VME Slave Tester is monitoring or performing a data transfer. Warning 23 light logic 66 may be implemented according to the conventional Boolean expression output to "warning" LED=DATA*·PSHBUT*·$\overline{\text{BLKDISP}}$, where the above signals are described in the APPENDIX.

Figure 3A:
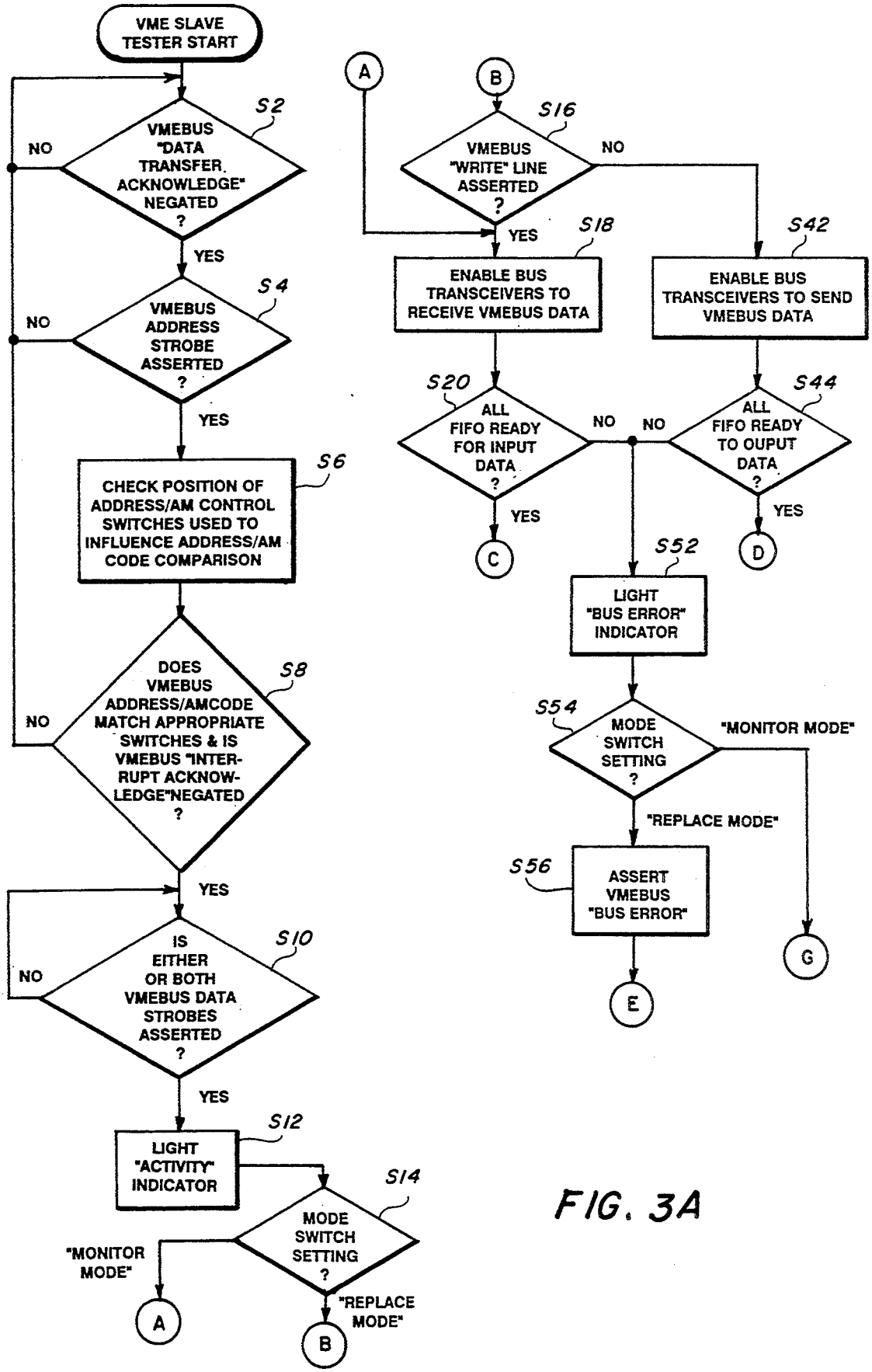
FIGS. 3A and 3B are flow charts describing the steps performed by the present invention.
Figure 3B:
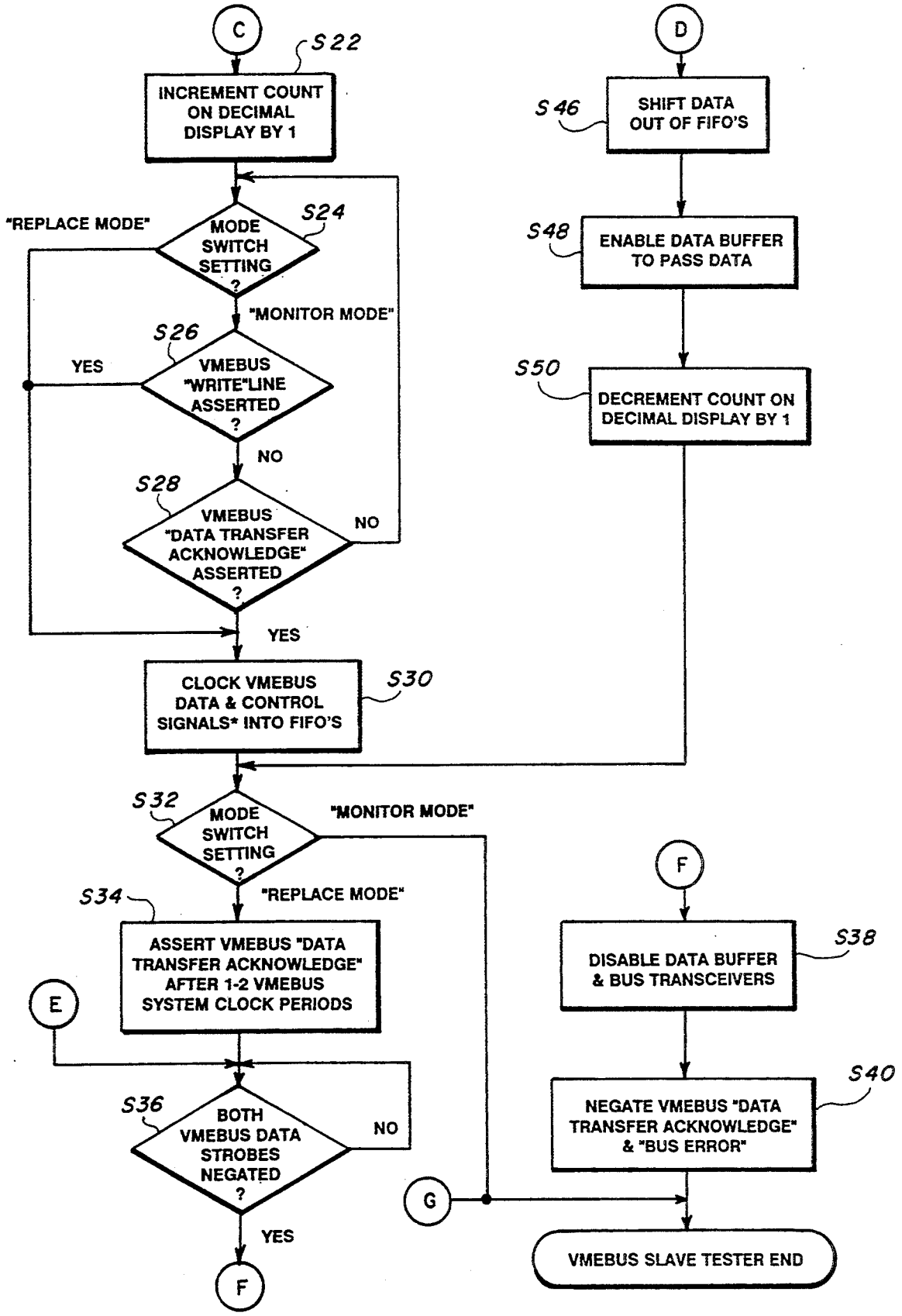

FIGS. 3A and 3B are flow charts representing the flow of the preferred embodiment of the present invention including the operations for determining when information is to be displayed by display circuit 4 but not including the specific operations for displaying the information. In FIG. 3A the board selector circuit 10 first determines in step S2 whether the VMEbus "data transfer acknowledge" (DTACK) signal is negated. If the "data transfer acknowledge" (DTACK) signal is negated, in step S4, the board selector circuit 10 determines whether the VMEbus address strobe (AS) is asserted. If the address strobe (AS) is asserted, then in step S6, the board selector circuit 10 checks the position of dip switches 12 used to control the address/address modifier code comparison. Next, in step S8, the board selector circuit 10 determines whether the VMEbus address/address modifier code matches the appropriate switch settings of dip switches 14 and whether the VMEbus "interrupt acknowledge" (IACK) signal is negated. If the result is yes, then step S10 is reached. If, however, any of the results of steps S2, S4 or S8 are no, then control is redirected back to step S2 again.

At step S10, the board selector circuit 10 determines whether both or either of the VMEbus data strobes (DS0,DS1) have been asserted. If the result is yes, then the activity indicator 72 of display circuit 4 is illuminated in step S12. Once the activity indicator 72 is illuminated, in step S14, the data transfer circuit 8 determines the mode in which the VME Slave Tester is operating based upon the setting of switch 79 in front panel control circuit 6. If the VME Slave Tester is operating in the monitor mode, in step S18 the data transfer circuit 8 enables bus transceiver 40 to receive VMEbus data.

In step S20, if all FIFO memories are ready to receive data, then counter 64 in display circuit 4 is incremented by 1 in step S22. Once the count has been incremented, in step S24 the data transfer circuit 8 again determines the mode in which the VME Slave Tester is operating. If switch 79 is set in the monitor mode, the data transfer circuit 8 determines in step S26 whether the VMEbus "write" (WRITE) line is asserted. If the "write" (WRITE) line is not asserted, then the data transfer circuit 8 determines whether the VMEbus "data transfer acknowledge" (DTACK) signal has been asserted in step S28. If the "data transfer acknowledge" (DTACK) signal has been asserted, the VMEbus data and control signals (DS0*, DS1*, A01, LWORD*, RDWRT) are clocked into the FIFO memory 38 in step S30. If switch 79 is set in the replace mode or if the VMEbus write (WRITE) line is asserted, then control moves from step S24 or S26 directly to step S30. In addition, if the VMEbus "data transfer acknowledge" (DTACK) signal is not asserted, then the control is directed from step S28 back to step S24.

Next, in step S32 the data transfer circuit 8 again determines what the operating mode of the VME Slave Tester is. If the VME Slave Tester is in the monitor mode, then control of the flow is directed to the end of the VME Slave Tester operation since no "data transfer acknowledge" (DTACK) signal is to be sent to the VMEbus. If the VME Slave Tester is in the replace mode, then data transfer circuit 8 in step S34 asserts a VMEbus "data transfer acknowledge" (DTACK) signal after 1 to 2 VMEbus system clock periods. Next, in step S36 the board selector circuit 10 determines whether both VMEbus data strobes (DS0,DS1) are negated. If both VMEbus data strobes (DS0,DS1) are negated, then buffer 37 and bus transceiver 40 are disabled by data transfer circuit 8 in step S38 and the VMEbus "data transfer acknowledge" (DTACK) and "bus error" (BERR) signals are negated in step S40 by the data transfer circuit 8. The VME Slave Tester operation then ends.

If the mode switch setting in step S14 is "replace mode", then in step S16 the data transfer circuit 8 determines whether the VMEbus "write" (WRITE) line is asserted. If the "write" line is asserted, then the flow continues from step S18 as described above.

If, however, in step S16, the VMEbus "write" (WRITE) line is not asserted, then bus transceiver 40 is enabled to send VMEbus data in step S42. In step S44, the FIFO circuit 2 determines whether all FIFO memories in FIFO memory 38 are ready to output data. If all FIFO memories are ready to output data, then data is shifted out of the FIFO memories in step S46 and buffer 37 is enabled to pass data in step S48 by FIFO circuit 2. Next, the count on the decimal display 78 in display circuit 4 is decremented by 1 in step S50 and the flow continues from step S32 as described previously.

If not all of the FIFO memories in FIFO memory 38 are ready to receive data in step S20 or to output data in step S44, then the "bus error" indicator light 52 in display circuit 4 is illuminated in step S52, and the data transfer circuit 8 in step S54 determines in what mode the VME Slave Tester is operating. If the VME Slave Tester is in the monitor mode, then the control is directed to the end of the VME Slave Tester operation since no "data transfer acknowledge" (DTACK) signal is to be sent to the VMEbus from the VME Slave Tester. If, however, the VME Slave Tester is in the replace mode, then a VMEbus "bus error" (BERR) signal is asserted in step S56 and the flow continues from step S36, as described previously.

Figure 4:
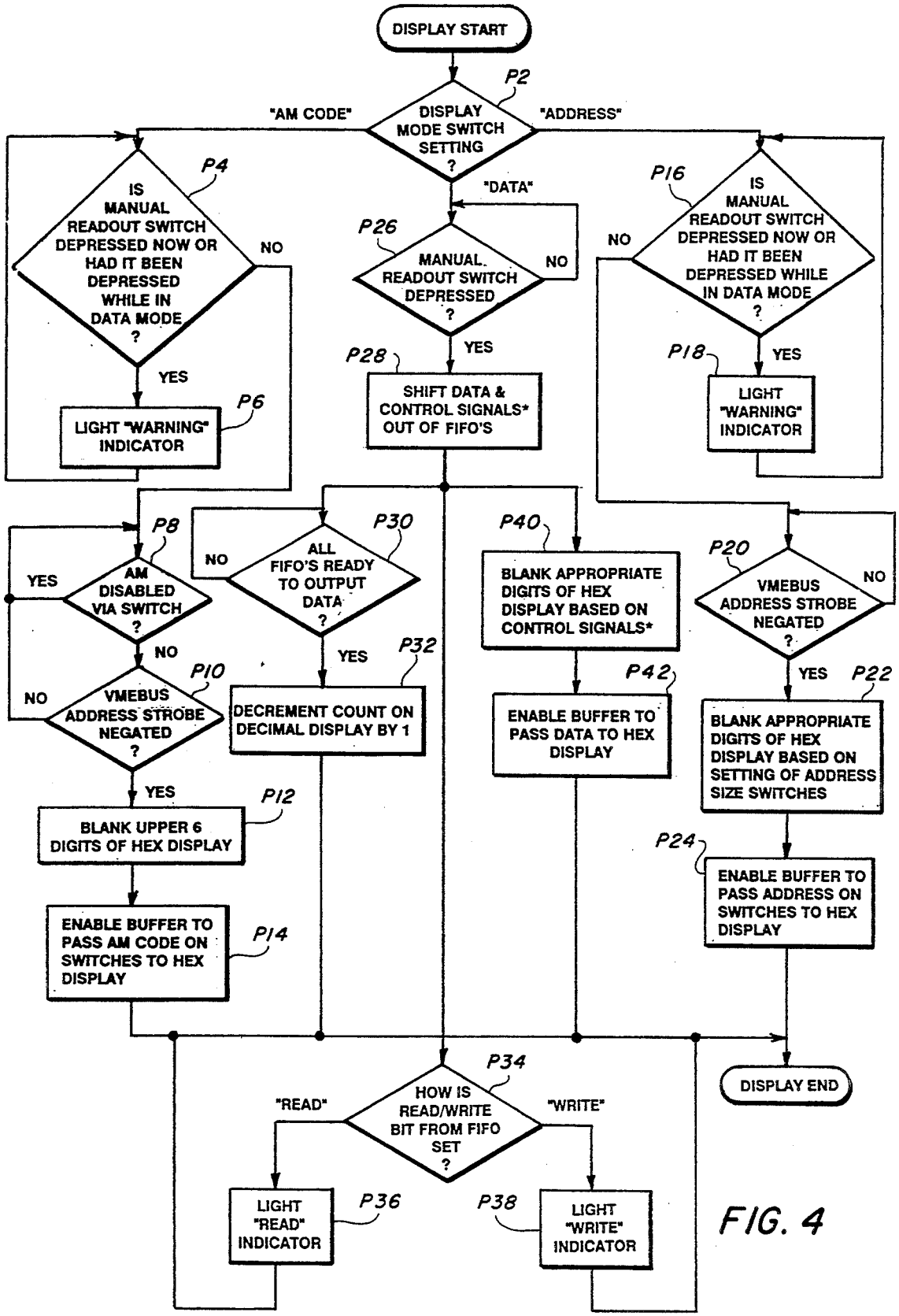
FIG. 4 is a flow chart describing the operation of displaying the information to the user.

FIG. 4 is a detailed description of the flow for the displaying of information determined to be displayed by the VME Slave Tester as described in FIGS. 3A and 3B. In FIG. 4, the display circuit 4 first determines the setting of the display mode switch 80 in step P2. If the switch setting is set as "address modifier code", then the display circuit 4 determines whether the manual readout switch 84 is currently depressed or whether the manual readout switch 84 has been depressed while in the data mode in step P4. If the result in P4 is yes, the warning indicator light 68 is illuminated in step P6. If the result in step P4 is no, then the display circuit 4 determines whether an address modifier disable switch in dip switch 12 is disabled in step P8. If the result of this step is no, then the display circuit 4 determines whether the VMEbus address strobe (AS) is negated in step P10.

If the VMEbus address strobe (AS) is negated, then the upper six digits of the hexadecimal display 74 are blanked in step P12 and the buffer 60 is enabled to pass the address modifier (AM) code set by the dip switches 14 to the hexadecimal display 74 in step P14. The display operation then ends.

If the display mode switch 80 is set in step P2 as "address" the display circuit 4 determines whether the manual read-out switch 84 is currently depressed or whether it was depressed while in the data mode in step P16. If the result of step P16 is yes, then the warning indicator light 68 is illuminated in step P18. If, however, the result of step P16 is no, then the display circuit 4 determines whether the VME address strobe (AS) is negated in step P20. If the VMEbus address strobe (AS) is negated, the appropriate digits of the hexadecimal display 74 are blanked based on the settings of the dip switches 12 in step P22 and buffer 60 is enabled to pass the addresses set by dip switches 14 to the hexadecimal display 74 in step P24. The display operation then ends.

If the display mode switch 80 is set to "data" in step P2, the display circuit 4 determines whether the manual read-out switch 84 is depressed in step P26. If the manual readout switch 84 is depressed, then the data and control signals (FDS0*, FDS1*, FA01, FLW*, FRDWR) are shifted out of the FIFO memories in FIFO memory 38 in step P28. The following steps P30, P34 and P40 are performed in parallel.

The data transfer circuit 8 determines whether all the FIFO memories are ready to output data in step P30. If the result in step P30 is yes, then the count on the decimal display 78 is decremented by one in step P32. In addition, after step P28, the appropriate digits of the hexadecimal display 74 are blanked based on the control signals in step P40 (LDS0*, LDS1*, LA01, LLW*, LRDWR) and buffer 37 is enabled to pass data to the hexadecimal display 74 in step P42. Finally, once the data and control signals have been shifted out of the FIFO memories in FIFO memory 38 in step P28, the display circuit 4 determines how the FIFO read/write (FRDWR) bit from the FIFO memory 38 is set in step P34. If the FIFO read/write (FRDWR) bit is set to "read", then the read indicator is illuminated by light emitting diode 76 in step P36. If, however, the FIFO read/write (FRDWR) bit is set to "write", then the write indicator is illuminated by light-emitting diode 76 in step P38. The display operation then ends. Thus, the display operation permits a user to obtain various information for determining whether a VME board has hardware or software problems.

The many features and advantages of the invention are apparent from the detailed specification and, thus, it is intended by the appended claims to cover all such features and advantages of the invention which fall within the true spirit and scope of the invention. Further, since numerous modifications and changes will occur to those skilled in the art, it is not desired to limit the invention to the exact construction and operation illustrated and described, and, accordingly, all suitable modifications and equivalents may be resorted to falling within the scope of the invention.

APPENDIX

A01–A31 (Address bits 1–31)—Three-state driven lines that specify a VMEbus address.

ADDR (Address)—A signal which indicates that the display mode switch 80 is in the "address" position.

ADDREN (Address Enable)—A signal used to indicate that the VME Slave Tester (VMEST) is in the address display mode.

ADMOD (Address Modifier Code)—A signal which indicates that the display mode switch 80 is in the "address modifier (AM) code" position.

AIR (All Inputs Ready)—A signal which indicates whether or not all first in/first out memories (FIFOs) are ready to accept input data. When the FIFOs are full, this signal remains negated until data is read from the FIFOs.

AM0–AM5 (AM Code bits 0–5)—Three-state driven lines that specify address-related information such as address size, cycle type, and master identification.

AMEN (Address Modifier Enable)—A signal used to indicate that the VMEST is in the address modifier (AM) code display mode.

AOR (All Outputs Ready)—A signal which indicates whether or not all FIFOs are ready to send output data. When the FIFOs are empty, this signal remains negated until data is written to the FIFOs.

AS (Address Strobe)—A three-state driven signal that indicates when a valid address is on the VMEbus.

BI0–BI3 (Blanking Inputs)—Signals used to blank digits of the hexadecimal display.

BAS (Board Address Strobe)—A signal which is functionally equivalent to the AS signal but buffered for use by the VMEST.

BERR (Bus Error)—An open-collector driven signal generated by a slave to indicate to the master that the data transfer was not completed.

BERREN (Bus Error Enable)—A signal which is asserted when either a VMEST Read Error or Write Error condition occurs.

BDTACK (Board Data Transfer Acknowledge)—A signal which is functionally equivalent to the DTACK signal but buffered for use by the VMEST.

BLCK (Block)—A switch-generated signal used to permit the VMEST to monitor or participate in VMEbus block transfers.

BLKDISP (Blank Display)—A control signal used primarily by the blanking logic.

BREDY (Board Ready)—A signal which indicates that the VMEST must be ready to send or receive data during a VMEbus data transfer cycle.

BSEL (Board Select)—A signal which indicates when the VMEST has been selected to monitor or participate in a VMEbus data transfer.

BSELCK (Board Select Clock)—A signal used to indicate when a valid VMEbus address and AM code matches that for which the VMEST is configured.

BSELCLR (Board Select Clear)—A signal which is used to negate BSEL during a VMEbus system reset or at the end of a data transfer cycle.

BWRITE (Board Write)—A signal used to indicate the direction of a VMEST data transfer. It is asserted for all VMEbus write cycles and monitor mode read cycles and is negated for replace mode read cycles.

CPUSO (CPU Shift Out)—A signal which indicates that the VMEST is ready to send data to the VMEbus.

D00–D31 (Data bits 0–31)—Three-state driven bidirectional data lines used to transfer data between a master and a slave.

DATA (Data)—A signal used to indicate that the VMEST is in the data display mode.

DISAM (Disable AM)—A switch-generated signal which tells the VMEST to ignore the AM code.

DS (Data Strobe)—A signal which indicates that either or both of the VMEbus data strobes are asserted.

DS0, DS1 (Data Strobes 0,1)—Three-state driven signals used in conjunction with LWORD and A01 to indicate how many data bytes are being transferred and to indicate the beginning and end of data transfers.

DTACK (Data Transfer Acknowledge)—An open-collector driven signal generated by a slave to indicate to the master when valid data is available on the VMEbus during a read cycle or has been accepted from the VMEbus during a write cycle.

DTACKGO (DTACK GO)—A signal which prepares the VMEST for generating a data transfer acknowledge during a VMEbus data transfer operation.

EX (Extended)—A switch-generated signal used in conjunction with ST/SH* to indicate the address size configuration of the VMEST.

FA01 (FIFO Address bit 1)—A FIFO output signal which indicates the state of the VMEbus address bit 1 for a given stored VMEbus data transfer cycle.

FDS0, FDS1 (FIFO Data Strobes 0,1)—FIFO output signals which indicate the state of the VMEbus data strobes for a given stored VMEbus data transfer cycle.

FFCLR (Flip-Flop Clear)—A signal used to reset the data transfer logic during a VMEbus system reset or at the end of a VMEbus data transfer cycle.

FLW (FIFO Longword)—A FIFO output signal which indicates the state of the VMEbus Longword signal for a given stored VMEbus data transfer cycle.

FRDWR (FIFO Read/Write)—A FIFO output signal which indicates the state of the VMEbus Read/Write Line for a given stored VMEbus data transfer cycle.

IACK (Interrupt Acknowledge)—An open-collector or three-state driven signal from an interrupt handler for acknowledging an interrupt request.

INDATA (Input Data)—A signal which indicates that the VMEST is ready to receive data from the VMEbus.

LA01 (Latch Address bit 1)—Latch output signal which stores the FA01 signal.

LDS0, LDS1 (Latch Data Strobes 0,1)—Latch output signal which stores the FDS0 and FDS1 signals.

LLW (Latch Longword)—Latch output signal which stores the FLW signal.

LOMAT (Lower Match)—A signal used to indicate a match between VMEbus address bits A01–A07 and the corresponding VMEST address configuration switches.

LRDWR (Latch Read/Write)—Latch output signal which stores the FRDWR signal.

LUPMAT (Lower Upper Match)—A signal used to indicate a match between VMEbus address bits A08–A15 and the corresponding VMEST address configuration switches.

LWORD (Longword)—A three-state driven signal used in conjunction with DS0, DS1, and A01 to specify which bytes within a 4-byte group are transferred during a data transfer cycle.

MANRES (Manual Reset)—A signal which indicates that the VMEST is being manually reset.

MODMAT (Modifier Match)—A signal used to indicate a match between the VMEbus AM code and the corresponding VMEST AM code configuration switches.

MR (Master Reset)—A signal used to clear all data from the FIFOs and to reset all on-board VMEST logic during a VMEbus system reset or manual reset operation.

MUPMAT (Middle Upper Match)—A signal used to indicate a match between VMEbus address bits A16–A23 and the corresponding VMEST address configuration switches.

PREMR (Pre-Master Reset)—Logically equivalent to the MR signal with the exception that this signal passes through a buffer.

PRESI (Pre-Shift In)—Logically equivalent to the SI signal with the exception that this signal passes through a buffer.

PRESO (Pre-Shift Out)—Logically equivalent to the SO signal with the exception that this signal passes through a buffer.

PSHBUT (Pushbutton)—A signal used to indicate when the manual readout switch has been depressed.

RCLK (Read Clock)—A signal which indicates that the VMEST must prepare to send data to the VMEbus.

RDWRT (Read/Write)—A signal which is functionally equivalent to the write signal but buffered for use by the VMEST.

REPL/MON* (Replace or Monitor)—A signal used to indicate the operational mode of the VMEST. It is asserted as a logic "high" state for replace mode and as a logic "low" state for monitor mode.

RERR (Read Error)—A signal which indicates that the VMEST was unable to send data to the VMEbus.

RESET (Reset)—A signal which is functionally equivalent to the SYSRESET signal but buffered for use by the VMEST.

SI (Shift In)—A signal generated to input data to the FIFOs when data is being written to the VMEST.

SO (Shift Out)—A signal generated to output data from the FIFOs during a VMEbus read or manual readout operation.

STEP (Step)—A signal asserted during a manual readout operation to generate Shift Out and to send data to the hexadecimal displays.

ST/SH* (Standard or Short)—A switch-generated signal used in conjunction with EX to indicate the address size configuration of the VMEST.

SYSCLK (System Clock)—A totem-pole driven 16 MHz clock signal that is independent of any other bus timing.

SYSRESET (System Reset)—An open-collector driven signal used to reset the VMEbus system.

UPMAT (Upper Match)—A signal used to indicate a match between VMEbus address bits A24–A31 and the corresponding VMEST address configuration switches.

WCLK (Write Clock)—A signal which indicates that the VMEST must prepare to receive data from the VMEbus.

WERR (Write Error)—A signal which indicates that the VMEST was unable to receive data from the VMEbus.

WRITE (Write)—A three-state driven signal generated by a master to indicate whether a data transfer cycle is a read or a write cycle. It is also called the "read/write line".

Note 1: Unless specified otherwise, all VMEST signals are totem-pole driven signals.

What is claimed is:

1. An apparatus for receiving and monitoring signals including control signals and monitored data on a VMEbus, said apparatus comprising:

monitor means, connected to said VMEbus, for monitoring said control signals received from said VMEbus, and for storing said monitored data when said control signals indicate that said monitored data is present in said signals to be monitored;

first switching means for setting said apparatus in one of monitor and replace modes; and a display circuit connected to said monitor means, said display circuit for displaying said monitored data in response to a command by a user to determine whether said monitored data received from said VMEbus corresponds to a predetermined data pattern.

2. An apparatus as recited in claim 1, wherein said control signals include address signals and said VMEbus includes addresses, and said apparatus further comprises:

second switching means for specifying which of said addresses said apparatus is to monitor using said address signals; and data transfer means, responsive to the one of said monitor and replace modes set by said first switching means, said data transfer means for determining whether said monitored data is one of first data received from said VMEbus and second data to be transmitted to said VMEbus.

3. A method for receiving and monitoring signals including control signals and monitored data on a VMEbus, said method comprising the steps of:

(a) setting a mode to one of monitor and replace modes;

(b) monitoring the control signals received from the VMEbus;

(c) storing the monitored data when the control signals indicate that the monitored data is present in the signals; and (d) displaying the monitored data in response to a command by a user to determine whether the monitored data received from the VMEbus corresponds to a predetermined data pattern.

4. The method as recited in claim 3, wherein said control signals include address signal and said VMEbus includes addresses, and said method, before said monitoring step (b), further comprises the steps of:

(b1) specifying which of the addresses is to be monitored using the address signals; and (b2) determining whether the data is one of first data received from the VMEbus and second data to be transmitted to the VMEbus is response to the mode set by said setting step (a).

5. An apparatus for receiving and monitoring signals including control signals, address signals and monitoring data on a VMEbus having addresses, said apparatus comprising:

a board select circuit specifying which of said addresses said apparatus is to monitor using said address signals;

a front panel control circuit, connected to said board select circuit, said front panel control circuit for setting said apparatus in one of a monitor mode and a replace mode;

a data transfer circuit, connected to said front panel control circuit, responsive to the one of said monitor and replace modes set by said front panel control circuit, and determining whether said monitored data is one of first data received from said VMEbus and second data to be transmitted to said VMEbus;

a first in/first out circuit (FIFO), connected to said data transfer circuit, said FIFO circuit for storing said first data received from said VMEbus or for releasing said second data to be transmitted to said VMEbus responsive to said data transfer circuit; and a display circuit, connected to said front panel control circuit, and displaying said monitored data in response to a command by a user to determine whether said data received from or said data transmitted to said VMEbus corresponds to a predetermined data pattern.

6. A method for receiving and monitoring signals including control signals, address signals and monitored data on a VMEbus having addresses, said method comprising the steps of:

(a) specifying which of the addresses is to be monitored using the address signals;

(b) setting a mode in one of a monitor mode and a replace mode;

(c) determining whether the monitored data is one of first data received from the VMEbus and second data to be transmitted to the VMEbus responsive to said setting step (b);

(d) transmitting said second data to the VMEbus or receiving said first data from the VMEbus responsive to said determining step (c); and (e) displaying the monitored data in response to a command by a user to determine whether said first data received from or said second data transmitted to the VMEbus corresponds to a predetermined data pattern.

* * * * *